(12) United States Patent
Chittipeddi et al.

(10) Patent No.: US 6,503,793 B1
(45) Date of Patent: Jan. 7, 2003

(54) METHOD FOR CONCURRENTLY FORMING AN ESD PROTECTION DEVICE AND A SHALLOW TRENCH ISOLATION REGION

(75) Inventors: Sailesh Chittipeddi, Allentown, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/927,752

(22) Filed: Aug. 10, 2001

(51) Int. Cl.[7] ......................................... H01L 21/8242
(52) U.S. Cl. ...................................... 438/243; 438/248
(58) Field of Search .............................. 438/238, 253, 438/243–249, 386–392, 381

(56) References Cited

U.S. PATENT DOCUMENTS

| | | | | |
|---|---|---|---|---|
| 5,075,571 A | * | 12/1991 | Dhong et al. ................ 327/390 |
| 5,879,980 A | * | 3/1999 | Selcuk et al. ................ 438/238 |
| 6,121,106 A | * | 9/2000 | Ellis et al. .................. 438/248 |
| 6,177,324 B1 | | 1/2001 | Song et al. | |
| 6,306,720 B1 | * | 10/2001 | Ding .......................... 438/386 |

* cited by examiner

*Primary Examiner*—Jey Tsai

(57) ABSTRACT

The present invention provides a method of forming a trench capacitor in an input/output region and a trench isolation structure in an active device region and a method of manufacturing an integrated circuit using the aforementioned method of forming. The invention comprises concurrently forming an isolation trench in an active region and a capacitive trench in an input/output region, concurrently forming a dielectric layer over the walls of the isolation trench and the capacitive trench, and forming a conductive material in the capacitive trench.

20 Claims, 5 Drawing Sheets

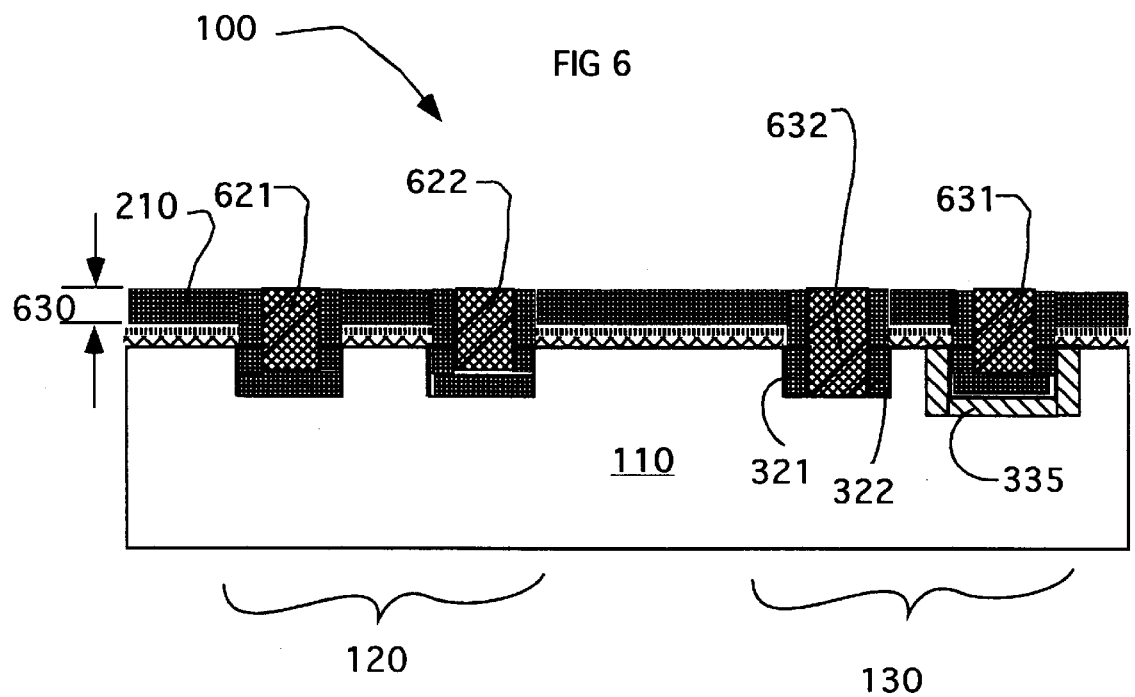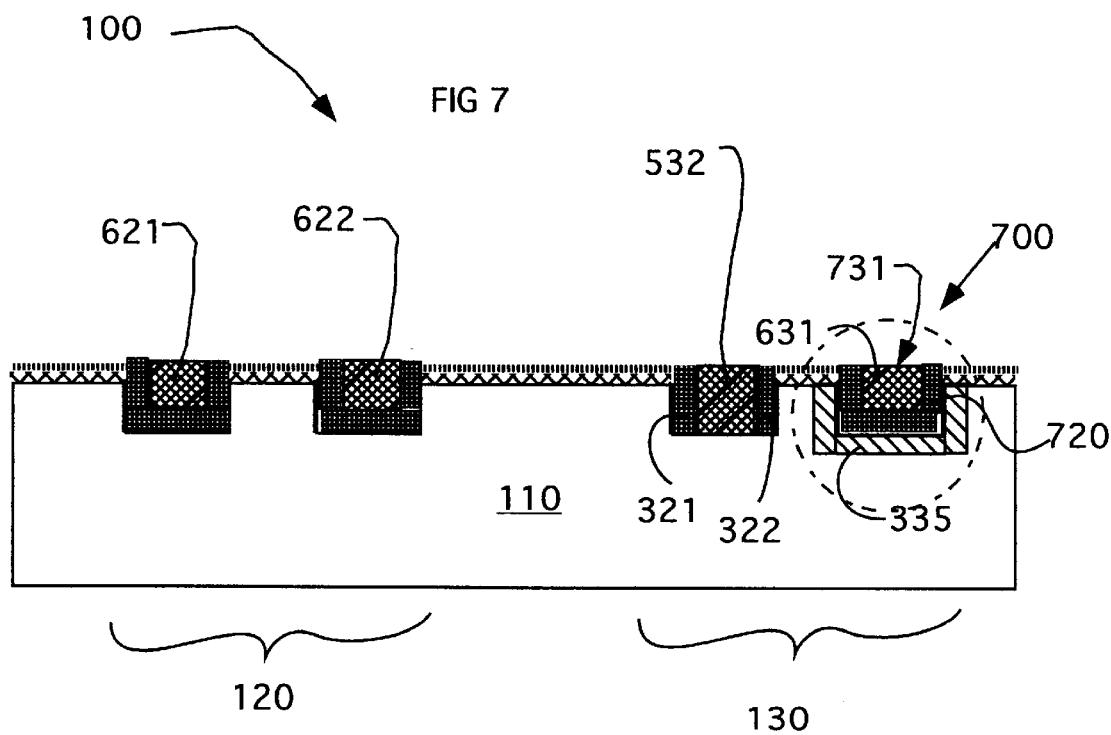

METHOD FOR CONCURRENTLY FORMING AN ESD PROTECTION DEVICE AND A SHALLOW TRENCH ISOLATION REGION

TECHNICAL FIELD OF THE INVENTION

The present invention is directed, in general, to semiconductor manufacturing and, more specifically, to a method for concurrently forming electrostatic discharge protection devices and shallow trench isolation regions.

BACKGROUND OF THE INVENTION

The continued drive toward decreased feature size in semiconductor devices to improve device performance has made the devices increasingly vulnerable to electrostatic discharge (ESD) damage. ESD can be triggered in a semiconductor device by any unforeseen build up of electrostatic charge in the semiconductor device. While ESD may occur in any part of a semiconductor device, the device can readily be damaged by a voltage surge that is introduced into the device via a bond pad. This voltage surge can be induced by direct contact with surrounding equipment to which the bond pad is connected, or by human contact. To prevent this kind of damage, an ESD protection circuit comprising at least a resistor and a capacitor is typically included in the design of the semiconductor device. The essential function of ESD protection is to direct the ESD current away from the semiconductor circuits that the ESD circuit is designed to protect. ESD circuits are used to protect memory circuits, MOSFET's and other semiconductor device applications for the protection of input/output buffers.

Protective ESD circuits are typically located between the input and output pads on the die and the transistor gates to which the pads are electrically connected. A 150 ns decaying pulse can be obtained with a 100 pf capacitor discharging into a 1.5 kΩ resistor and then into the integrated circuit. Conventional ESD capacitors are formed as layers, i.e., a gate over a thin oxide over a substrate, wherein the thin oxide functions as the dielectric. Such capacitors may require relatively large areas to provide the required capacitance. Thus, conventional ESD circuits are constrained in size by the capacitor. With the continued emphasis on making integrated circuits ever smaller, it is highly desirable to be able to reduce the footprint of the ESD capacitor.

Accordingly, what is needed in the art is a method of forming an ESD capacitor that overcomes the deficiencies associated with conventional ESD capacitors.

SUMMARY OF THE INVENTION

To address the above-discussed deficiencies of the prior art, the present invention provides a method of forming a trench capacitor in an input/output region and a trench isolation structure in an active device region and a method of manufacturing an integrated circuit using the aforementioned method of forming. In one embodiment the invention comprises concurrently forming, in a conductive substrate, an isolation trench and a capacitive trench in an input/output region, concurrently forming a dielectric layer over the walls of the isolation trench and the capacitive trench, and forming a conductive material in the capacitive trench.

BRIEF DESCRIPTION OF THE DRAWINGS

The invention is best understood from the following detailed description when read with the accompanying FIGURES. It is emphasized that in accordance with the standard practice in the electronics industry, various features may not be drawn to scale. In fact, the dimensions of the various features may be arbitrarily increased or reduced for clarity of discussion. Reference is now made to the following descriptions taken in conjunction with the accompanying drawings, in which:

FIG. 6 illustrates a membranous sectional view of the semiconductor wafer of FIG. 5 after filling the trenches;

FIG. 7 illustrates a membranous sectional view of the semiconductor wafer of FIG. 6 after planarizing the wafer.

DETAILED DESCRIPTION

Figure 1:
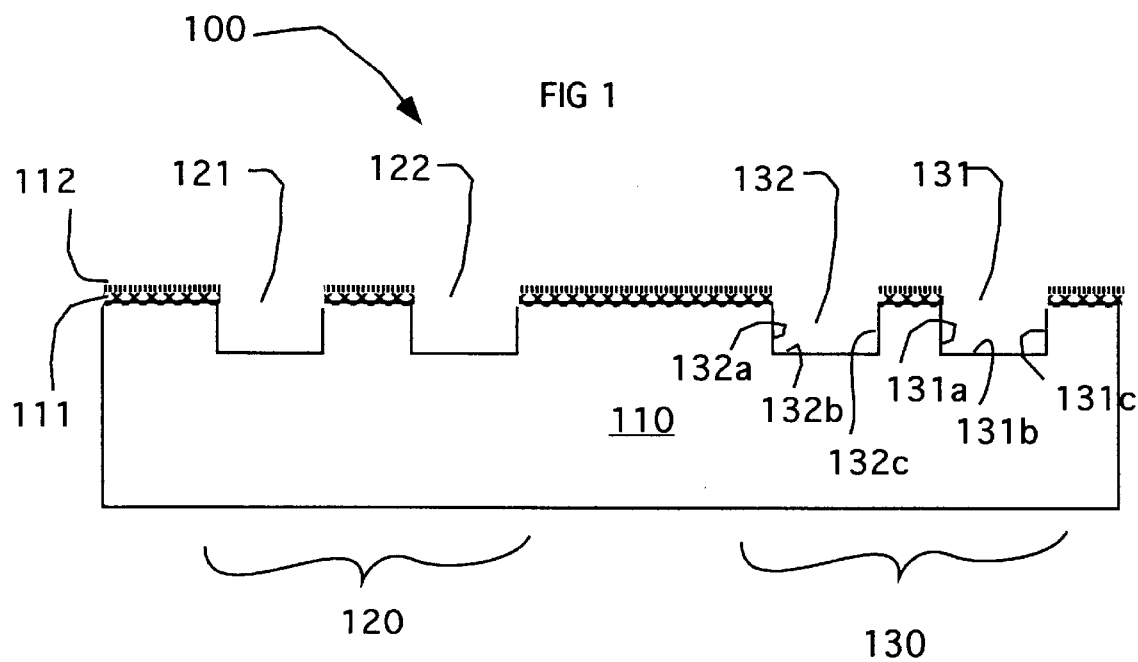
FIG. 1 illustrates a membranous sectional view of one embodiment of a portion of a conventional semiconductor wafer at an early stage of manufacture wherein the semiconductor wafer comprises a conductive substrate having an active device region and an input/output region.

For the purpose of this discussion, a membranous sectional view is a sectional view of an object in which the view has a membranous thickness. Therefore, features behind the plane of the section are not displayed, as they would be in a conventional sectional view, thereby avoiding confusion. Referring initially to FIG. 1, illustrated is a membranous sectional view of one embodiment of a portion of a conventional semiconductor wafer 100 at an early stage of manufacture wherein the semiconductor wafer comprises a conductive substrate 110 having an active device region 120 and an input/output region 130. The active device region 120 comprises trenches 121, 122 that are typically shallow in depth, and that may be referred to as a shallow trench isolation structure. As the name implies, active devices are typically formed in the active device region 120. These active region(s) 120 of the integrated circuits are electrically isolated by forming non-active regions between these circuits. These non-active regions may be field oxide regions or may be shallow trench isolation (STI) regions. The input/output region 130 comprises a capacitive trench 131 and a contact trench 132. The conductive substrate 110 further comprises a thin silicon dioxide layer 111 and a thin silicon nitride layer 112. One who is skilled in the art is familiar with the deposition and employment of oxide/nitride layers 111, 112 and the conventional methods used to form the trenches 121, 122, 131, 132 during semiconductor manufacture. For the purposes of this discussion, the capacitive trench 131 and contact trench 132 have surfaces 131a–131c, 132a–132c, respectively, that may be termed walls 131a–131c, 132a–132c, respectively. Because the shallow isolation trench 122 and the capacitive trench 131 are formed simultaneously they have substantially equal depths. In a preferred embodiment, the shallow isolation trench 122 and the capacitive trench 131 are equal in depth.

Figure 2:
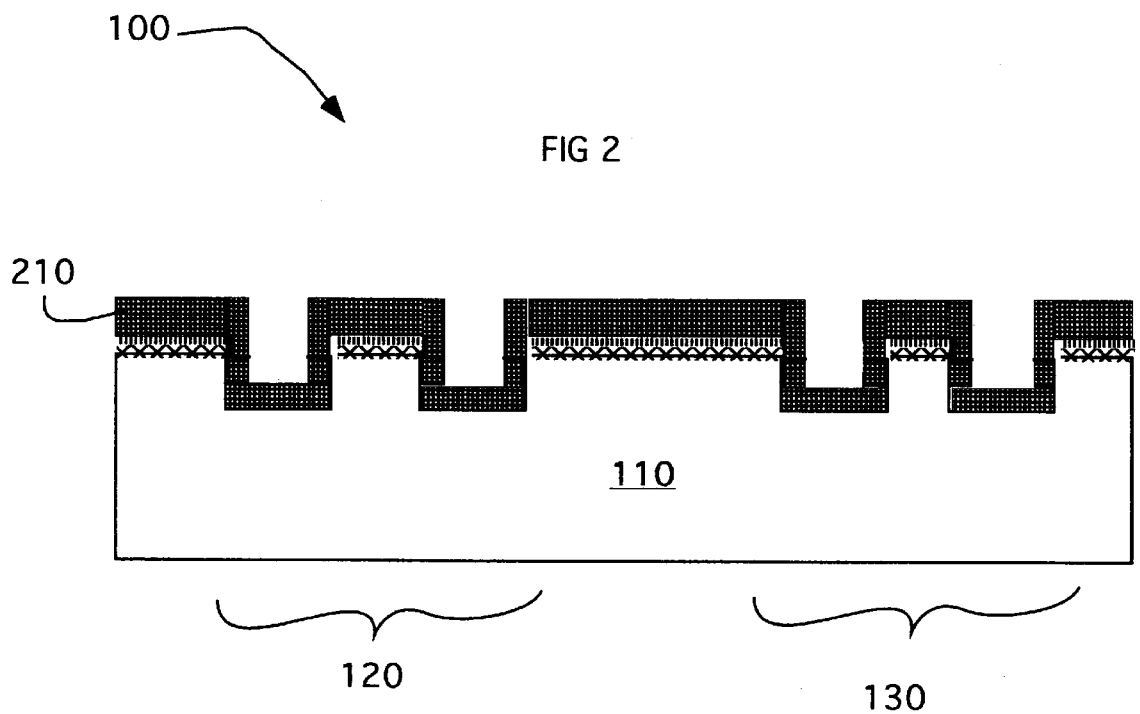
FIG. 2 illustrates a membranous sectional view of the semiconductor wafer of FIG. 1 after deposition of a silicon dioxide dielectric layer.

Referring now to FIG. 2, illustrated is a membranous sectional view of the semiconductor wafer 100 of FIG. 1 after deposition of a silicon dioxide dielectric layer 210. The silicon dioxide layer 210 may be concurrently deposited over both the active device region 120 and the input/output region 130 using a conventional plasma-enhanced tetraethylorthosilicate (PETEOS) deposition process.

Figure 3A:
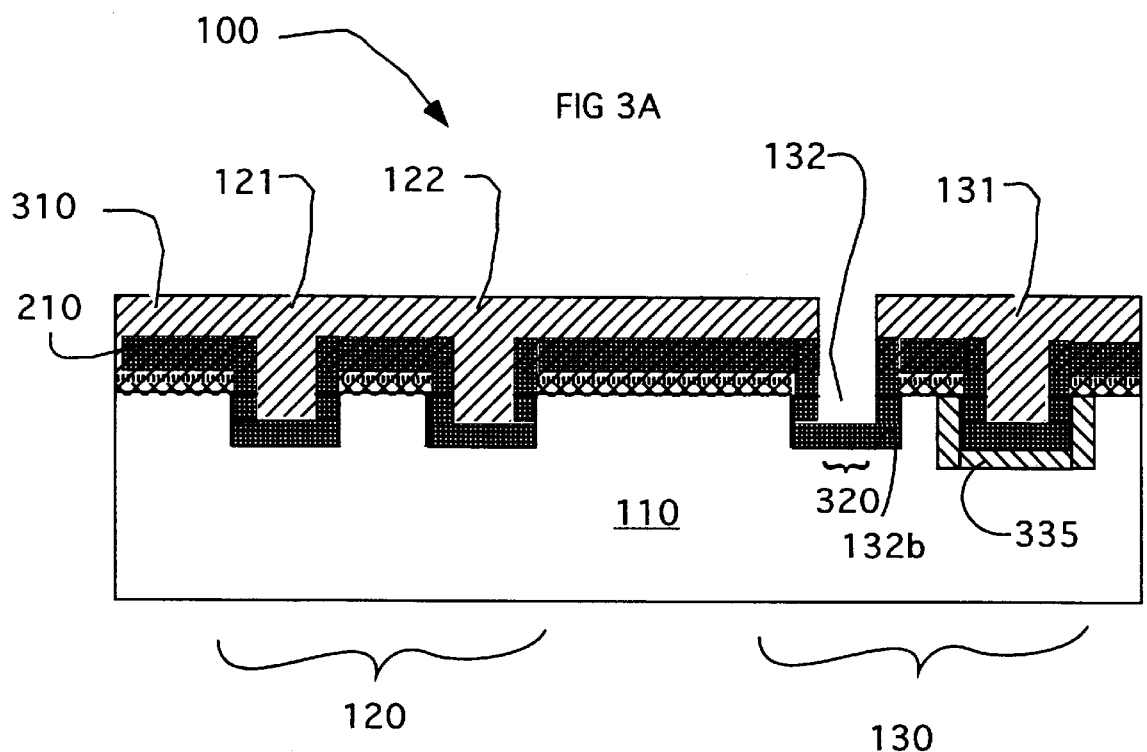
FIG. 3A illustrates a membranous sectional view of the semiconductor wafer of FIG. 2 after forming and patterning a photoresist layer according to the principles of the present invention.

Referring now to FIG. 3A, illustrated is a membranous sectional view of the semiconductor wafer 100 of FIG. 2 after forming and patterning a photoresist layer 310 according to the principles of the present invention. As shown, the photoresist layer 310, formed concurrently over the active device region 120 and the input/output region 130, selectively exposes a portion 320 of the silicon dioxide layer 210 proximate the wall 132b of the trench 132 to subsequent processing.

Figure 3B:
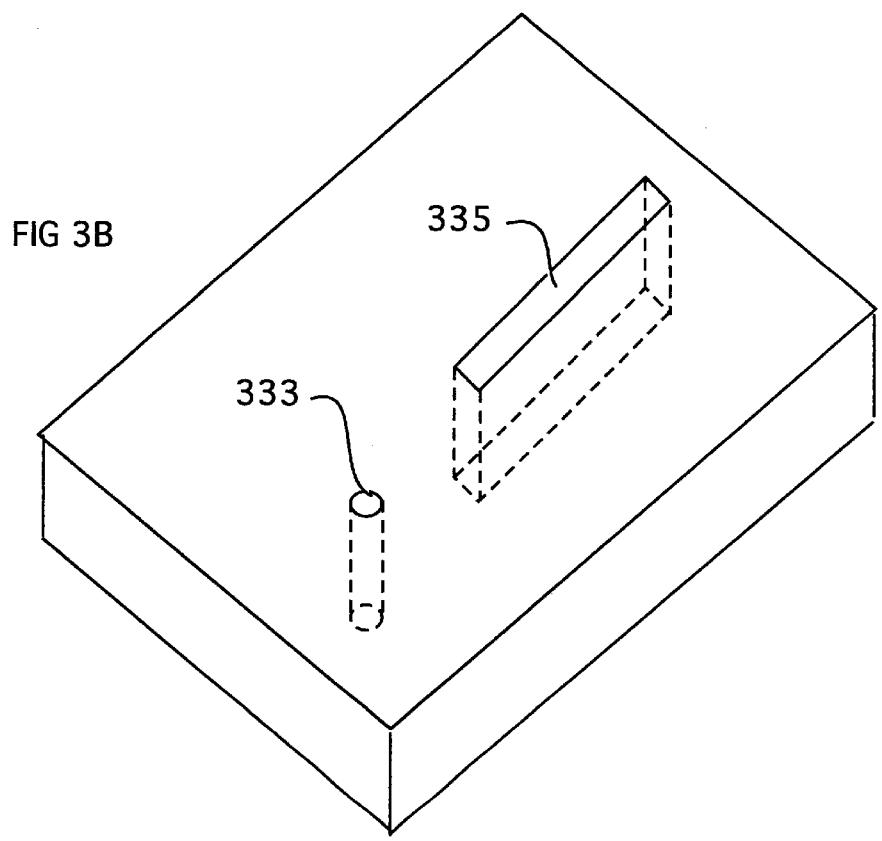
FIG. 3B illustrates an isometric view of the semiconductor wafer of FIG. 2 with a conventional, cylindrical contact opening and a contact trench.

Contact trench 132 preferably becomes a conductive path to a region 335 of the substrate 110 that can serve as a lower plate 335 of a capacitor (not yet completed) to be formed in the substrate 110. While the contact trench 132 is illustrated in FIG. 3A, one who is skilled in the art will recognize that a contact could also be conventional in nature, i.e., cylindrical. To illustrate the difference between a contact trench and a contact opening, refer now to FIG. 3B, wherein is illustrated an isometric view of a conventional semiconductor wafer 330 with a conventional, cylindrical contact opening 333 and a contact trench 335. One who is skilled in the art will readily observe that using a contact trench 335 allows for a lower contact resistance than the conventional, cylindrical contact opening 333.

Figure 4:
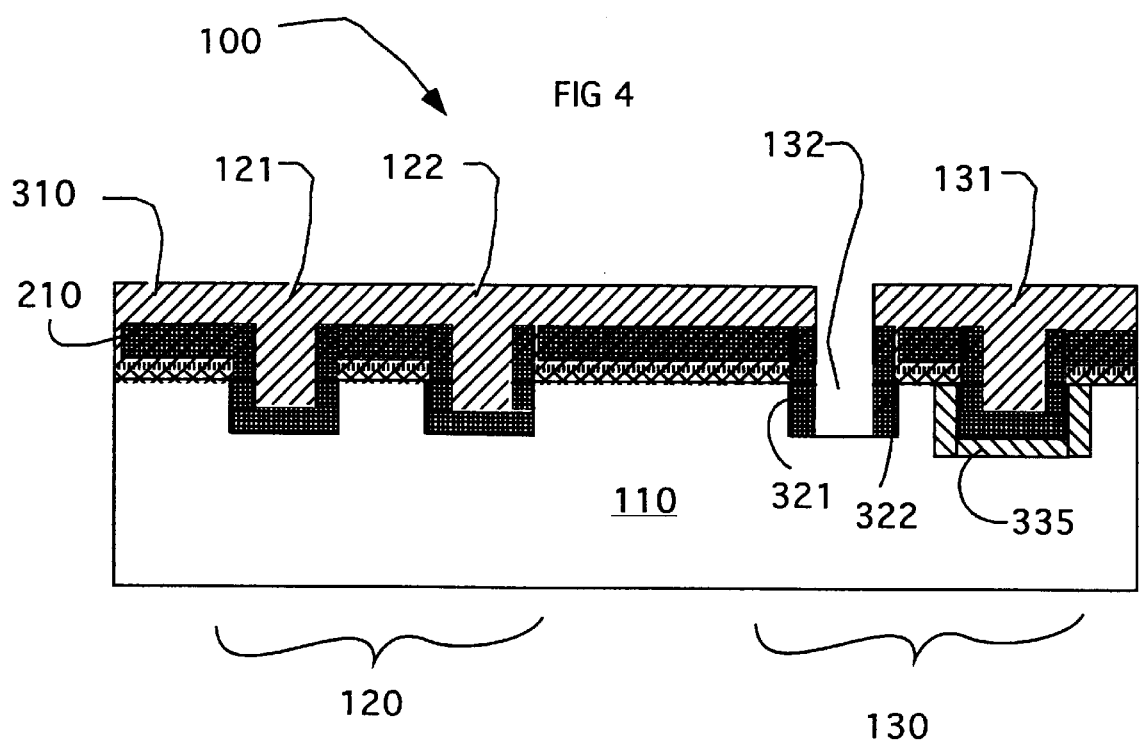
FIG. 4 illustrates a membranous sectional view of the semiconductor wafer of FIG. 3A after the contact etch.
Figure 5:
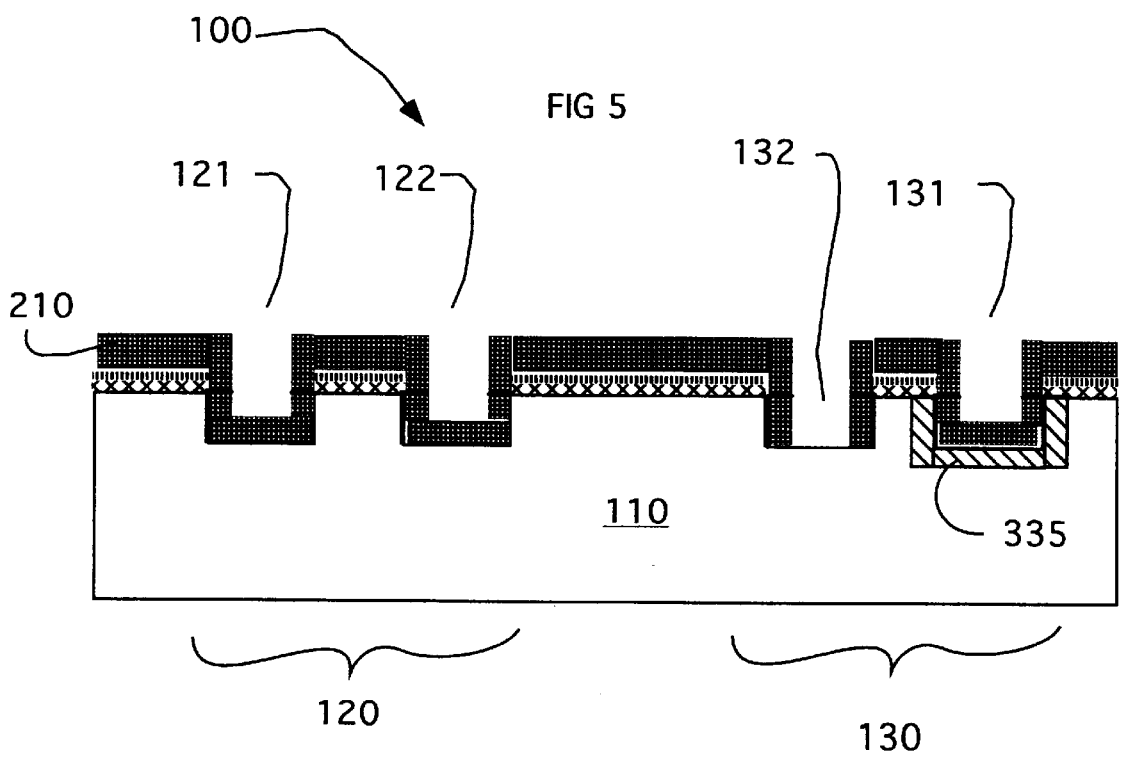
FIG. 5 illustrates a membranous sectional view of the semiconductor wafer of FIG. 4 after concurrently removing the photoresist layer from both the active device region and the input/output region.

The substrate 110 of FIG. 3A is next subjected to a contact etch that removes the portion 320 of the silicon dioxide layer 210. Referring now to FIG. 4, illustrated is a membranous sectional view of the semiconductor wafer 100 of FIG. 3A after the contact etch. Note that by comparing to FIG. 3A, portion 320 of the silicon dioxide layer 210 has been removed. It should be noted that sidewalls 321, 322 of the oxide layer 210 are intentionally retained in the contract trench 132. The semiconductor wafer 100 is next subjected to a photoresist removal. Referring now as required to FIGS. 4 and 5, FIG. 5 illustrates a membranous sectional view of the semiconductor wafer 100 of FIG. 4 after concurrently removing the photoresist layer 310 from both the active device region 120 and the input/output region 130.

Referring now to FIG. 6, illustrated is a membranous sectional view of the semiconductor wafer 100 of FIG. 5 after filling the trenches 121, 122, 131, 132. Using conventional processes, the trenches 121, 122, 131, 132 are filled with a conductive material, e.g., polysilicon, tungsten silicide, tungsten, etc., individually identified as 621, 622, 631, 632. Portions, i.e., a thickness, collectively identified as 630, of the silicon dioxide layer 210 and of the conductive material 621, 622, 631, 632 are removed by chemical/mechanical planarization. Conductive material 631 will become the upper plate 631 of the capacitor. While only two trenches 121, 122 that form the shallow trench isolation structure are shown, one who is skilled in the art will understand that much more complex devices may similarly be formed in the active device region 120.

Referring now to FIG. 7, illustrated is a membranous sectional view of the semiconductor wafer 100 of FIG. 6 after planarizing the wafer 100. Planarization has removed those portions 630 of the silicon dioxide layer 210 and the excess conductive material 621, 622, 631, 632 concurrently from both the active device region 120 and the input/output region 130. This planarization process prepares the semiconductor wafer 100 for formation of additional structures. A capacitor 700, that is by function an electrostatic discharge protection circuit capacitor 700, has now been formed in the input/output region 130 comprising the lower plate 335, a dielectric 720 that was previously a part of the silicon dioxide layer 210, and the upper plate 631. Electrical contact to the upper plate 631 may be made conventionally on a surface 731 and electrical contact to the lower plate 335 may be made through the lower plate contact 532.

Figure 8:
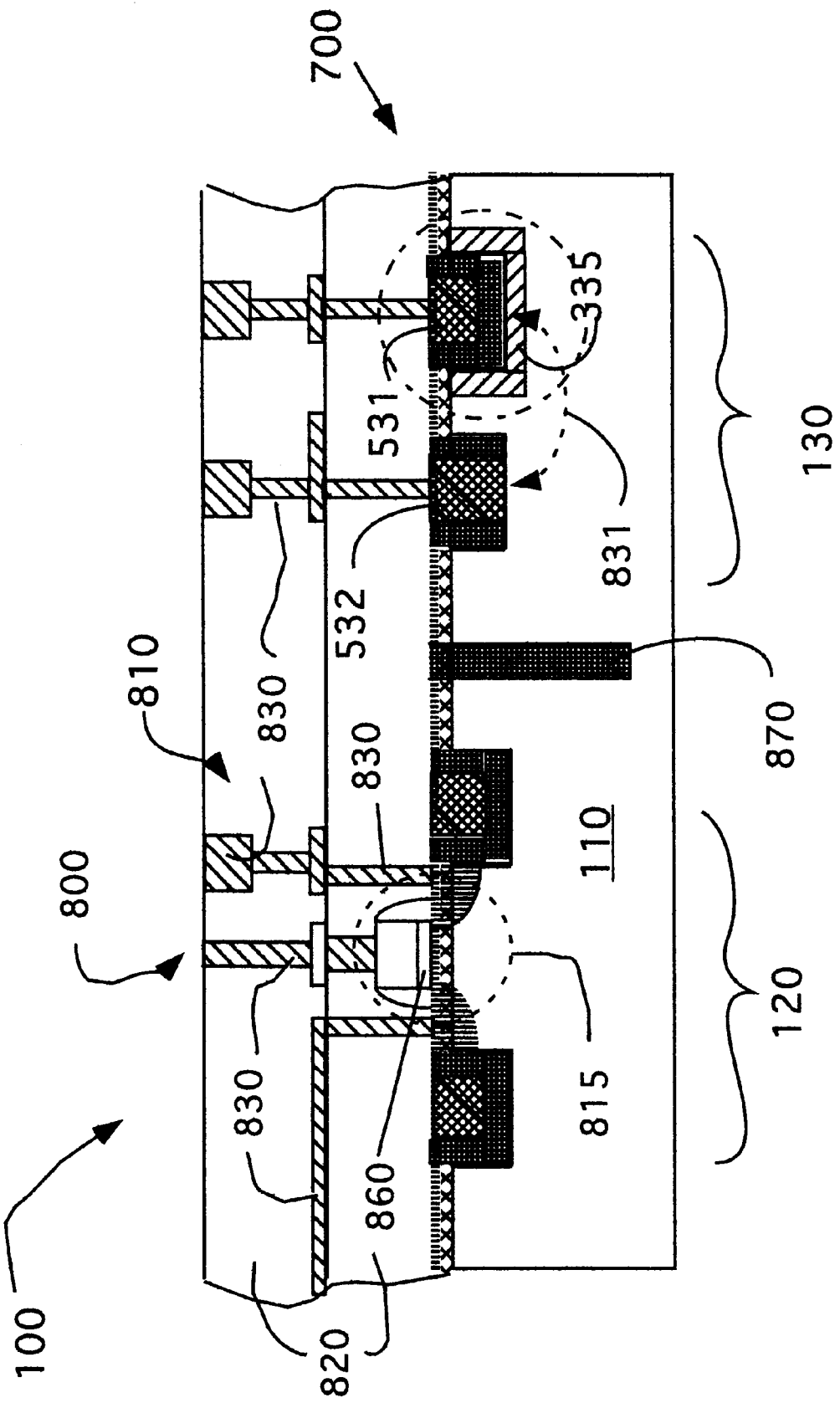
FIG. 8 illustrates a membranous sectional view of a conventional integrated circuit (IC) incorporating the completed electrostatic discharge capacitor of FIG. 7.

Referring now to FIG. 8, illustrated is a membranous sectional view of a conventional integrated circuit (IC) 800 incorporating the completed electrostatic discharge protection circuit capacitor 700 of FIG. 7. The IC 800 may include active devices, e.g., transistors 815, used to form CMOS devices, BiCMOS devices, bipolar devices, or other types of active devices. The IC 800 may further include passive devices such as inductors or resistors, or it may also include optical devices or optoelectronic devices. Those skilled in the art are familiar with these various types of device and their manufacture.

Active devices 810 are found in the active device region 120 and separated from the capacitor 700 in the input/output region 130 by a deep isolation trench 870. One who is skilled in the art is familiar with deep isolation trenches and methods of forming them. The input/output region 130 may also now be recognized as an electrostatic discharge region. One who is skilled in the art is familiar with the employment of capacitors in electrostatic discharge protection circuits.

In the embodiment illustrated in FIG. 8, components of the conventional IC 800 include transistor(s) 815 (one shown), having gate oxide layer(s) 860 (one shown), formed on a semiconductor wafer. The transistor(s) 815 may be metal-oxide semiconductor field effect transistors 815 (MOSFETS), however other types of transistors are within the scope of the present invention. Interlevel dielectric layers 820 are then shown deposited over the transistor(s) 815.

Interconnect structures 830 are formed in the interlevel dielectric layers 820 to form interconnections between the transistors 810 and other devices (not shown) to form an operative integrated circuit 800. In addition, the interconnect structures 830 also connect the transistor(s) 815 to other areas or components of the IC 800 and the capacitor 700 to other components of an ESD protection circuit. Those skilled in the art understand how to connect these various devices together to form an operative integrated circuit.

Of course, use of the method of manufacturing capacitors of the present invention is not limited to the manufacture of the particular IC 800 illustrated in FIG. 8. In fact, the present invention is broad enough to encompass the manufacture of any type of integrated circuit formed on a semiconductor wafer which would benefit from the use of trench capacitors located therein, as provided by the present invention. In addition, the present invention is broad enough to encompass integrated circuits having greater or fewer components than illustrated in the IC 800 of FIG. 8. Beneficially, each time the method of the present invention is employed to form part or all of a semiconductor capacitor in the IC 800, manufacturing costs may be eliminated from the entire manufacturing process due to the reduced number of capacitor layers needed within a given footprint.

Thus, the present invention provides a method for forming a capacitor of reduced footprint in an input/output region while concurrently forming at least part of an active region of an integrated circuit. Therefore, the invention reduces the footprint and process steps needed to form an ESD capacitor in an input/output region.

Although the present invention has been described in detail, those skilled in the art should understand that they can make various changes, substitutions and alterations to the disclosed conception and specific embodiment herein without departing from the spirit and scope of the invention in its broadest form. Those skilled in the art should also realize that such equivalent constructions do not depart from the spirit and scope of the invention in its broadest form.

What is claimed is:

1. A method of forming a capacitor in an input/output region and a trench isolation structure in an active device region, comprising:
   concurrently forming, in a conductive substrate, an isolation trench in an active device region and a capacitive trench in an input/output region;
   concurrently forming a dielectric layer over the walls of the isolation trench and the capacitive trench; and
   forming a conductive material in the capacitive trench.

2. The method as recited in claim 1 further including forming a contact trench adjacent the capacitive trench in the input/output region concurrently with forming the capacitive trench.

3. The method as recited in claim 2 wherein concurrently forming a dielectric layer includes concurrently forming a dielectric layer in the contact trench.

4. The method as recited in claim 3 wherein the method further includes removing a portion of the dielectric layer from a wall of the contact trench.

5. The method as recited in claim 4 further including filling the contact trench with the conductive material.

6. The method as recited in claim 5 wherein filling includes filling the contact trench with polysilicon, tungsten silicide or tungsten.

7. The method as recited in claim 1 wherein forming a conductive material comprises forming a conductive material of polysilicon, tungsten silicide or tungsten.

8. The method as recited in claim 1 wherein concurrently forming a dielectric layer includes concurrently forming an oxide layer over the walls of the isolation trench and the capacitive trench.

9. The method as recited in claim 1 wherein concurrently forming a dielectric layer includes concurrently forming a silicon dioxide layer over the walls of the isolation trench and the capacitive trench.

10. The method as recited in claim 1 further comprising forming a deep isolation trench between the isolation trench and the input/output region.

11. A method of manufacturing an integrated circuit, comprising:
    creating a capacitor in an input/output region and a trench isolation structure in an active device region including:
       concurrently forming, in a conductive substrate, an isolation trench in an active device region and a capacitive trench in an input/output region;
       concurrently forming a dielectric layer over the walls of the isolation trench and the capacitive trench; and
       forming a conductive material in the capacitive trench;
    forming active or passive devices over the conductive substrate; and
    interconnecting the active or passive devices and the trench capacitor to form an operative integrated circuit.

12. The method as recited in claim 11 further including forming a contact trench adjacent the capacitive trench in the input/output region concurrently with forming the capacitive trench.

13. The method as recited in claim 12 wherein concurrently forming a dielectric layer includes concurrently forming a dielectric layer in the contact trench.

14. The method as recited in claim 13 wherein the method further includes removing a portion of the dielectric layer from a wall of the contact trench.

15. The method as recited in claim 14 further including filling the contact trench with the conductive material.

16. The method as recited in claim 15 wherein filling includes filling the contact trench with polysilicon, tungsten silicide or tungsten.

17. The method as recited in claim 11 wherein forming a conductive material comprises forming a conductive material of polysilicon, tungsten silicide or tungsten.

18. The method as recited in claim 11 wherein concurrently forming a dielectric layer includes concurrently forming an oxide layer over the walls of the isolation trench and the capacitive trench.

19. The method as recited in claim 11 wherein concurrently forming a dielectric layer includes concurrently forming a silicon dioxide layer over the walls of the isolation trench and the capacitive trench.

20. The method as recited in claim 11 further comprising forming a deep isolation trench between the isolation trench and the input/output region.

* * * * *